(12) United States Patent
Chan et al.

(10) Patent No.: US 6,982,442 B2
(45) Date of Patent: Jan. 3, 2006

(54) STRUCTURE AND METHOD FOR MAKING HETEROJUNCTION BIPOLAR TRANSISTOR HAVING SELF-ALIGNED SILICON-GERMANIUM RAISED EXTRINSIC BASE

(75) Inventors: Kevin K. Chan, Staten Island, NY (US); Marwan H. Khater, Poughkeepsie, NY (US); Kathryn T. Schonenberg, Wappingers Falls, NY (US); Panda Siddhartha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,712

(22) Filed: Jan. 6, 2004

(65) Prior Publication Data

US 2005/0151165 A1  Jul. 14, 2005

(51) Int. Cl.
  *H01L 29/737* (2006.01)
(52) U.S. Cl. ...................... 257/198; 257/197
(58) Field of Classification Search ............... 257/198, 257/197
  See application file for complete search history.

(56) References Cited

U.S. PATENT DOCUMENTS

| 5,128,271 | A | | 7/1992 | Bronner et al. |
| 5,323,032 | A | * | 6/1994 | Sato et al. .................. 257/198 |
| 5,494,836 | A | | 2/1996 | Imai |
| 5,506,427 | A | | 4/1996 | Imai |
| 5,583,059 | A | * | 12/1996 | Burghartz .................. 438/319 |
| 5,962,880 | A | | 10/1999 | Oda et al. |
| 6,346,453 | B1 | | 2/2002 | Kovacic et al. |
| 6,642,553 | B1 | * | 11/2003 | Drews et al. ............... 257/197 |
| 2002/0024061 | A1 | * | 2/2002 | Kondo et al. ............... 257/198 |

* cited by examiner

*Primary Examiner*—Jerome Jackson
(74) *Attorney, Agent, or Firm*—Daryl K. Neff; H. Daniel Schnurmann

(57) ABSTRACT

A heterojunction bipolar transistor (HBT) and method of making an HBT are provided. The HBT includes a collector, and an intrinsic base overlying the collector. The intrinsic base includes a layer of a single-crystal semiconductor alloy. The HBT further includes a raised extrinsic base having a first semiconductive layer overlying the intrinsic base and a second semiconductive layer formed on the first semiconductive layer. An emitter overlies the intrinsic base, and is disposed in an opening of the first and second semiconductive layers, such that the raised extrinsic base is self-aligned to the emitter.

9 Claims, 12 Drawing Sheets

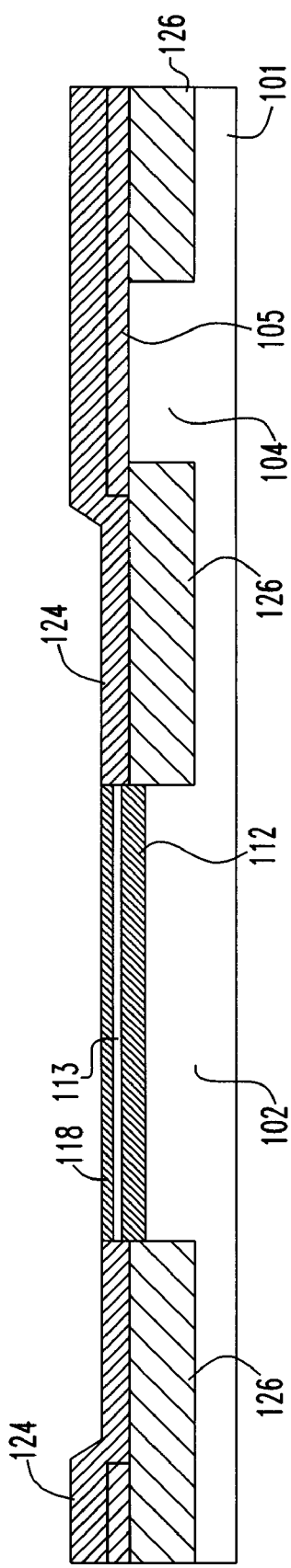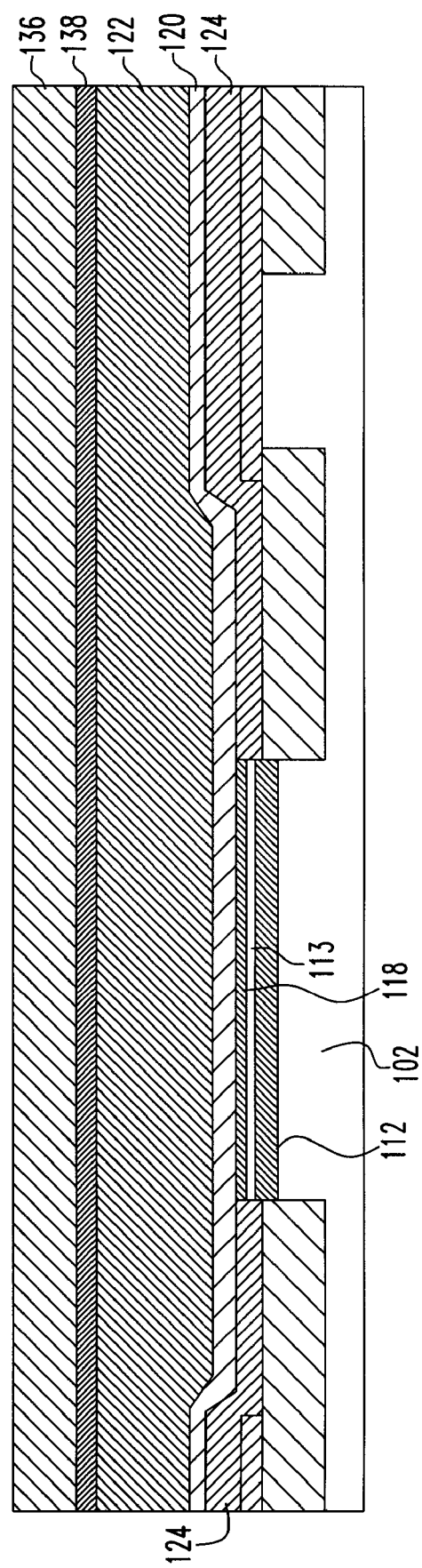

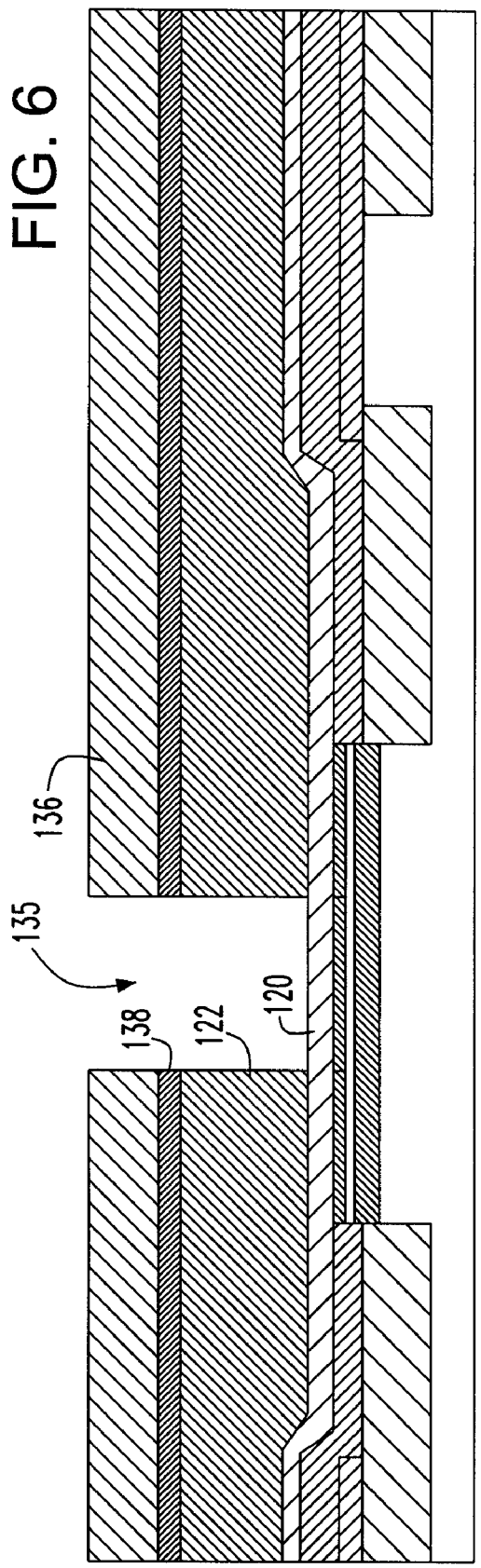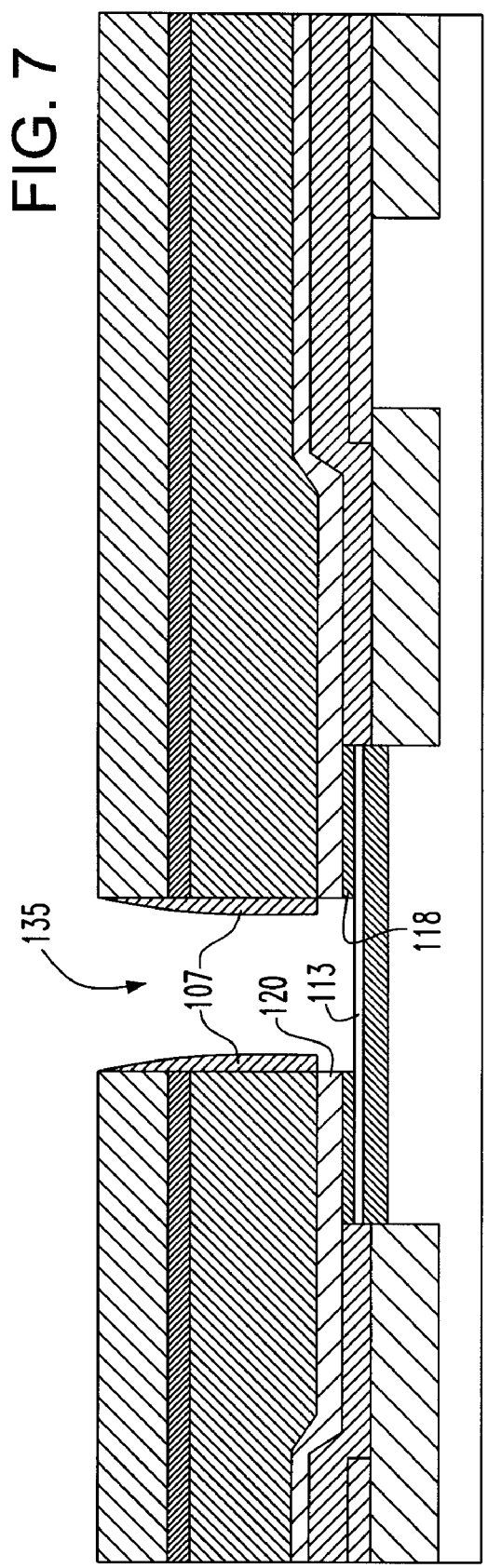

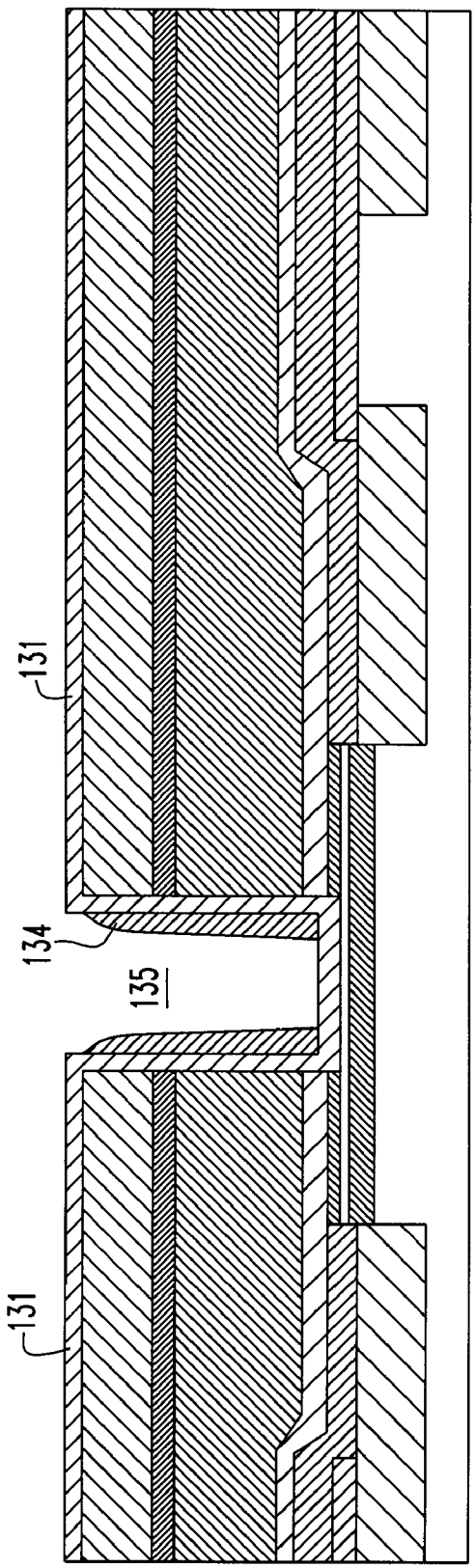
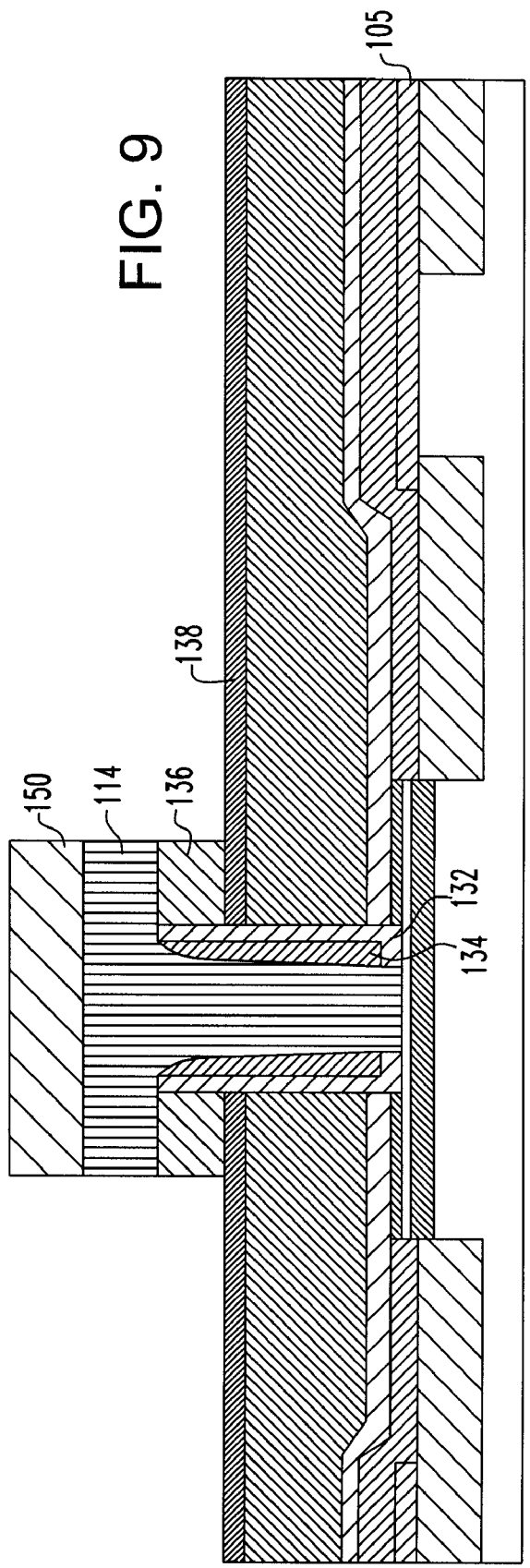

STRUCTURE AND METHOD FOR MAKING HETEROJUNCTION BIPOLAR TRANSISTOR HAVING SELF-ALIGNED SILICON-GERMANIUM RAISED EXTRINSIC BASE

BACKGROUND OF INVENTION

High performance circuits, especially those used for radio frequency chips, favor the use of heterojunction bipolar transistors (HBTs) to provide high maximum oscillation frequency $f_{MAX}$ and cutoff frequency $f_T$. HBTs have a structure in which the base of the transistor includes a relatively thin layer of single-crystal semiconductor alloy material. As an example, an HBT fabricated on a substrate of single-crystal silicon can have a single-crystal base formed of silicon germanium (SiGe) having a substantial proportion of germanium content and profile to improve high speed performance. Such HBT is commonly referred to as a SiGe HBT.

The juxtaposition of alloy semiconductor materials within a single semiconductor crystal is called a "heterojunction." The heterojunction results in significant quasi-static field that increases the mobility of charge carriers in the base. Increased mobility, in turn, enables higher gain and cutoff frequency to be achieved than in transistors having the same semiconductor material throughout.

As provided by the prior art, differences exist among SiGe HBTs which allow them to achieve higher performance, or to be more easily fabricated. A cross-sectional view of one such prior art SiGe HBT 10 is illustrated in FIG. 1. Such non self-aligned HBT 10 can be fabricated relatively easily, but other designs provide better performance. As depicted in FIG. 1, the HBT 10 includes an intrinsic base 12, which is disposed in vertical relation between the emitter 14 and the collector 16. The intrinsic base 12 includes a single-crystal layer of SiGe (a single-crystal of silicon germanium having a substantial proportion of germanium). The SiGe layer forms a heterojunction with the collector 16 and a relatively thin layer of single-crystal silicon 13 which is typically present in the space between the SiGe layer and the emitter 14.

A raised extrinsic base 18 is disposed over the intrinsic base 12 as an annular structure surrounding the emitter 14. The purpose of the raised extrinsic base 18 is to inject a base current into the intrinsic base 12. For good performance, the interface 24 between the raised extrinsic base 18 and the intrinsic base is close to the junction between the emitter 14 and the intrinsic base 12. By making this distance small, the resistance across the intrinsic base 12 between the interface 24 and the emitter 14 is decreased, thereby reducing the base resistance $R_b$ (hence RC delay) of the HBT 10. It is desirable that the interface 24 to the raised extrinsic base be self-aligned to the edge of the emitter 14. Such self-alignment would exist if the raised extrinsic base were spaced from the emitter 14 only by the width of one or more dielectric spacers formed on a sidewall of the raised extrinsic base 18.

However, in the HBT 10 shown in FIG. 1, the interface 24 is not self-aligned to the emitter 14, and the distance separating them is not as small or as symmetric as desirable. A dielectric landing pad, portions 21, 22 of which are visible in the view of FIG. 1, is disposed as an annular structure surrounding the emitter 14. Portions 21, 22 of the landing pad separate the raised extrinsic base 18 from the intrinsic base 12 on different sides of the emitter 14, making the two structures not self-aligned. Moreover, as shown in FIG. 1, because of imperfect alignment between lithography steps used to define the edges of portions 21 and 22 and those used to define the emitter opening, the lengths of portions 21 and 22 can become non-symmetric about the emitter opening, causing performance to vary.

The landing pad functions as a sacrificial etch stop layer during fabrication. The formation of the landing pad and its use are as follows. After forming the SiGe layer of the intrinsic base 12 by epitaxial growth onto the underlying substrate 11, a layer of silicon 13 is formed over the SiGe layer 12. A layer of silicon dioxide is deposited as the landing pad and is then photolithographically patterned to expose the layer 13 of single-crystal silicon. This photolithographic patterning defines the locations of interface 24 at the edges of landing pad portions 21, 22, which will be disposed thereafter to the left and the right of the emitter 14. A layer of polysilicon is then deposited to a desired thickness, from which layer the extrinsic base 18 will be formed.

Thereafter, an opening is formed in the polysilicon by anisotropically etching the polysilicon layer (as by a reactive ion etch) selectively to silicon dioxide, such etch stopping on the landing pad. After forming a spacer in the opening, the landing pad is then wet etched within the opening to expose silicon layer 13 and SiGe layer 12. A problem of the non-self-aligned structure of HBT 10 is high base resistance. Resistance is a function of the distance of a conductive path, divided by the cross-sectional area of the path. As the SiGe layer 12 is a relatively thin layer, significant resistance can be encountered traversing the distance under landing pad portions 21, 22 to the area under the emitter 14, such resistance limiting the high speed performance of the transistor.

FIG. 2 is a cross-sectional view illustrating another HBT 50 according to the prior art. Like HBT 10, HBT 50 includes an intrinsic base 52 having a layer of silicon germanium and an extrinsic base 58 consisting of polysilicon in contact with the single-crystal intrinsic base 52. However, unlike HBT 10, HBT 50 does not include landing pad portions 21, 22, but rather, the raised extrinsic base 58 is self-aligned to the emitter 54, the extrinsic base 58 being spaced from the emitter 54 by dielectric spacer. Self-aligned HBT structures such as HBT 50 have demonstrated high $f_T$ and $f_{MAX}$ as reported in Jagannathan, et al., "Self-aligned SiGe NPN Transistors with 285 GHz $f_{MAX}$ and 207 GHz $f_T$ in a Manufacturable Technology," IEEE Electron Device letters 23, 258 (2002) and J. S. Rieh, et al., "SiGe HBTs with Cut-off Frequency of 350 GHz," International Electron Device Meeting Technical Digest, 771 (2002). In such self-aligned HBT structures, the emitter 54 is self-aligned to the raised extrinsic base 58.

Two types of methods are provided in the prior art for fabricating HBTs 50 like that shown in FIG. 2. According to one approach, chemical mechanical polishing (CMP) is used to planarize the extrinsic base polysilicon over a pre-defined sacrificial emitter pedestal, as described in U.S. Pat. Nos. 5,128,271 and 6,346,453. A drawback of this method is that the extrinsic base layer thickness, hence the transistor performance, can vary significantly between small and large devices, as well as, between low and high density areas of devices due to dishing of the polysilicon during CMP.

In another approach, described in U.S. Pat. Nos. 5,494,836, 5,506,427 and 5,962,880, the intrinsic base is grown using selective epitaxy inside an emitter opening and under an overhanging polysilicon layer of the extrinsic base. In this approach, self-alignment of the emitter to the extrinsic base is achieved by the epitaxially grown material under the overhang. However, with this approach, special crystal growth techniques are required to ensure good, low-resistance contact between the intrinsic base and the extrinsic base.

It would be desirable to provide a self-aligned HBT and method for making the HBT which is more easily performed and kept within tolerances, and which, therefore, overcomes the challenges to the performance of the prior art HBT and prior art fabrication methods.

SUMMARY OF INVENTION

Accordingly, a heterojunction bipolar transistor (HBT) and a method for making the HBT are provided. According to an aspect of the invention, the HBT includes a collector, and an intrinsic base overlying the collector, the intrinsic base including a layer of a single-crystal semiconductor alloy. The HBT further includes a raised extrinsic base having a first semiconductive layer overlying the intrinsic base and a second semiconductive layer formed on the first semiconductive layer, wherein the first semiconductive layer is etch distinguishable from the second semiconductive layer. An emitter overlies the intrinsic base, and is disposed in an opening of the first and second semiconductive layers, such that the raised extrinsic base is self-aligned to the emitter.

According to a preferred aspect of the invention, a heterojunction bipolar transistor (HBT) is provided. The HBT includes a collector, an intrinsic base overlying the collector, the intrinsic base including a first layer consisting essentially of an alloy of silicon and germanium, and a second layer consisting essentially of silicon. The HBT further includes a raised extrinsic base including a first semiconductive layer overlying the intrinsic base, the first semiconductive layer having a first composition according to $Si_{x1}Ge_{y1}$, x1 and y1 being complementary percentages wherein y1 is equal to or greater than zero, the raised extrinsic base further including a second semiconductive layer formed on the first semiconductive layer, having a second composition according to $Si_{x2}Ge_{y2}$, x2 and y2 being complementary percentages, wherein the percentage y2 is substantially greater than the percentage y1, such that the second semiconductive layer is etch distinguishable from the first semiconductive layer.

An emitter overlies the intrinsic base, the emitter being disposed in an opening of the first and second semiconductive layers, and the emitter being spaced from the raised extrinsic base by at least one dielectric spacer formed on a sidewall of the opening.

According to preferred aspects of the invention, an HBT is provided which includes a layer of silicon germanium (SiGe) (single-crystal or polycrystalline) as an element of the raised extrinsic base. Such layer is disposed over a relatively thin layer consisting essentially of silicon (single-crystal or polycrystalline silicon) which provides an etch stop layer when the overlying SiGe layer is etched to form an emitter opening. In this manner, a self-aligned transistor is fabricated using a simple method, similar to that of making a non-self-aligned transistor, by plasma etching the SiGe extrinsic base layer selective to the "conductive" silicon stop layer, the plasma etch process having high selectivity. After forming the emitter opening, the thin polysilicon layer is removed in a straightforward manner such that the emitter is formed in the opening thereafter in contact with the intrinsic base. In such manner, the raised extrinsic base is self-aligned to the emitter. Besides simplifying the process of self-aligning the raised extrinsic base, the polycrystalline SiGe layer of the raised extrinsic base reduces the base resistance. Doped polycrystalline SiGe and single-crystal SiGe have lower resistance than comparable doped polysilicon and single-crystal silicon.

According to another aspect of the invention, a method of making a heterojunction bipolar transistor is provided which includes forming a collector, forming an intrinsic base overlying the collector, the intrinsic base having a first layer including a first layer consisting essentially of an alloy of silicon and germanium and the second layer consisting essentially of silicon. An extrinsic base is formed by steps including forming a first semiconductive layer over the intrinsic base, forming a second semiconductive layer contacting the first semiconductive layer, and vertically etching an opening in the second semiconductive layer, stopping on the first semiconductive layer. The opening is then extended downwardly through the first semiconductive layer to expose the intrinsic base. An emitter contacting the intrinsic base is formed in the extended opening, such that the raised extrinsic base is self-aligned to the emitter.

BRIEF DESCRIPTION OF DRAWINGS

FIGS. 3 through 11 illustrate a self-aligned heterojunction bipolar transistor and its fabrication according to a first preferred embodiment of the invention.

DETAILED DESCRIPTION

Figure 1:
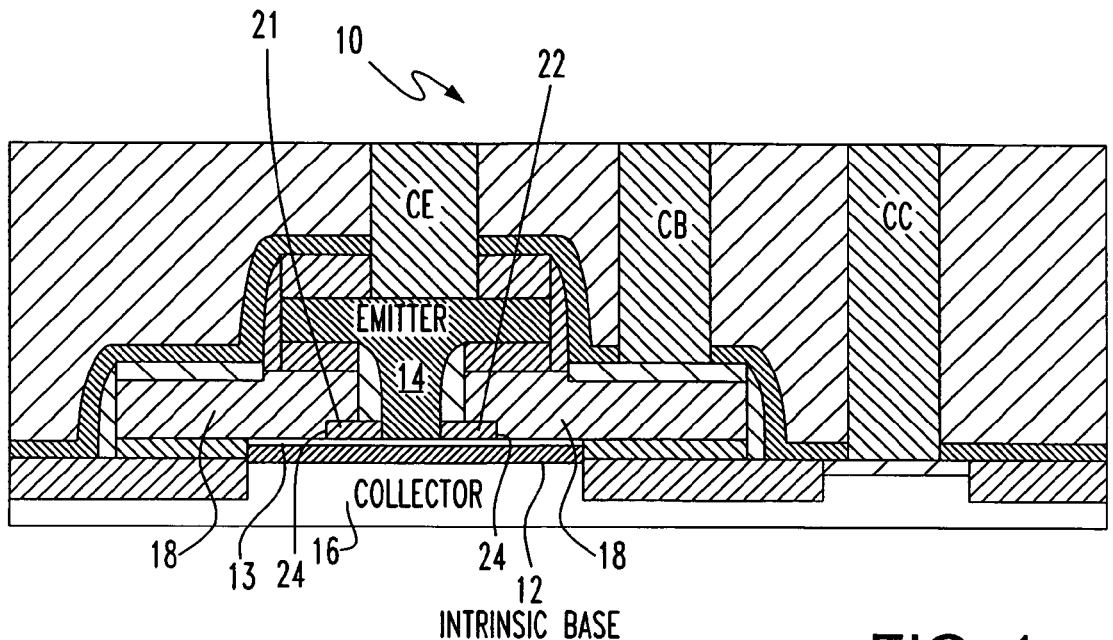
FIG. 1 illustrates a non-self-aligned heterojunction bipolar transistor according to the prior art, in which the raised extrinsic base is formed of polysilicon and is not self-aligned to the emitter.
Figure 2:
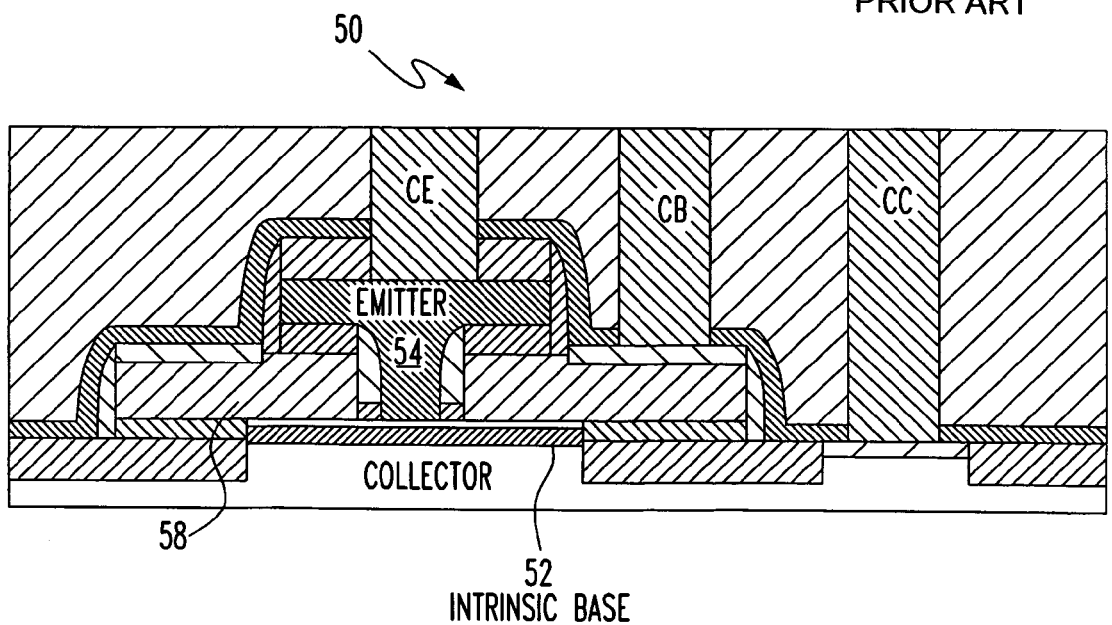
FIG. 2 illustrates a self-aligned heterojunction bipolar transistor according to the prior art, in which the raised extrinsic base is formed of polysilicon and is self-aligned to the emitter.
Figure 3:
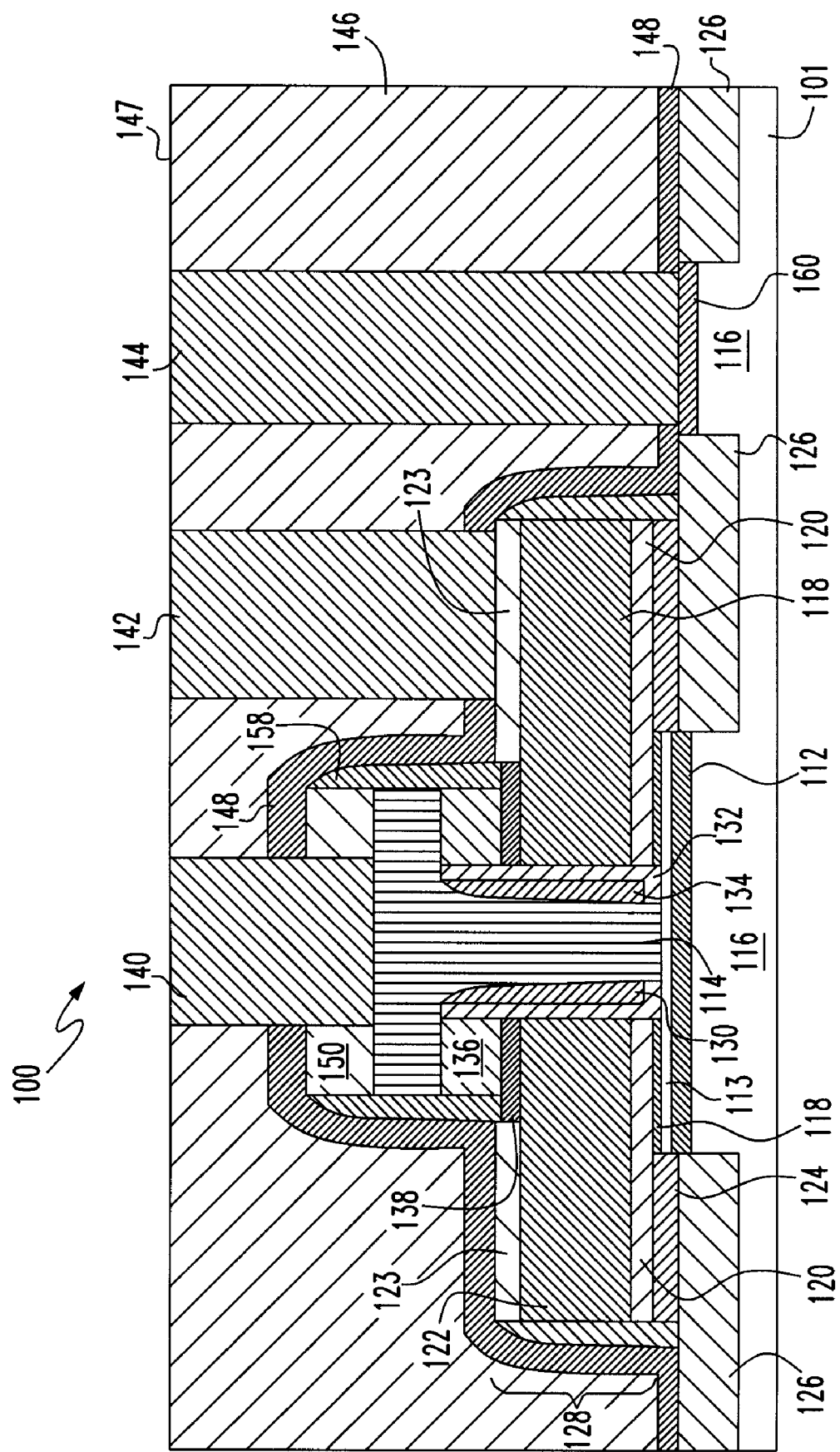

FIG. 3 is a cross-sectional view illustrating the structure of an HBT 100 according to a first preferred embodiment of the invention. As shown in FIG. 3, HBT 100 is desirably fabricated from a substrate 101, e.g. wafer, of single-crystal silicon. The HBT 100 includes an intrinsic base including a single-crystal layer of silicon germanium 112 disposed over a collector 116 region of the silicon substrate 101. The intrinsic base further includes a single-crystal layer 113 of silicon disposed over the SiGe layer 112. A single-crystal layer 118 of silicon germanium is further disposed over the silicon layer 113. An emitter 114, desirably consisting of polysilicon, contacts the single-crystal silicon layer 113 from above. The raised extrinsic base of the HBT 100 includes SiGe layer 118, polycrystalline silicon layer 120, a polycrystalline SiGe layer 122, and a polycrystalline silicon layer 138 and a silicide layer 123 disposed over portions of the polycrystalline SiGe layer 122. A layer 124 of polycrystalline SiGe formed during the epitaxial growth of intrinsic base SiGe layer 112 is also disposed over a shallow trench isolation region 126 to the side of layers 112, 113, and 118. Thus, the raised extrinsic base of HBT 100 is formed as a stack 128 of semiconductor layers including layers 118, 120, 122, 123 and 138 formed over the intrinsic base including at least SiGe layer 112 and silicon layer 113.

The raised extrinsic base 128 is self-aligned to the emitter 14 and spaced therefrom by a dielectric spacer 130 disposed between the two structures. The spacer 130 desirably has a two-part structure, including a first spacer 132 of silicon dioxide formed on a sidewall of the raised extrinsic base 128, and a second spacer 134 of silicon nitride formed over the first spacer 132.

The raised extrinsic base 128 has an annular shape, surrounding the emitter 114 which extends downwardly to contact single-crystal silicon layer 113 through an opening etched into the raised extrinsic base 128. A layer of deposited silicon dioxide such as a TEOS (tetraethylorthosilicate) oxide 136 separates an upper portion of emitter 114 from a layer of polysilicon 138 contacting SiGe layer 122. Vertical contact to each of the raised extrinsic base 128, emitter 114 and collector 116 from a overlying wiring level (not shown) are provided through metal or metal-silicide filled via holes 140, 142, and 144 that are etched into an overlying deposited inter-level dielectric layer (ILD) 146 and one or more additional dielectric layers 148 and 150. Desirably, dielectric layers 148 and 150 consist essentially of silicon nitride, and ILD 146 consists essentially of a deposited silicon dioxide such as a TEOS oxide or borophosphosilicate glass (BPSG).

A method for fabricating the HBT 100 shown in FIG. 3 is illustrated in FIGS. 4 through 11. As depicted in FIG. 4, a single-crystal silicon substrate 101 is patterned to form a first active area 102 and a second active area 104, and shallow trench isolations 126 between the active areas. Desirably, the shallow trench isolations 126 are filled with a dense oxide, such as may be provided by a high electron density plasma (HDP) deposition. A layer 105 of dielectric material, preferably formed by depositing silicon dioxide, such as from a TEOS precursor, is patterned to expose first active area 102 but not second active area 104.

Also depicted in FIG. 4, a stack of layers 112, 113 and 118 including intrinsic base layers 112 and 113 is epitaxially grown. Such layers are formed as follows. A layer 112 of silicon germanium having a substantial percentage content of germanium is epitaxially grown on a surface of first active area 102. Such layer 112 desirably has a germanium content which is greater than 20%, while the silicon content makes up a complementary percentage. Then, first the single-crystal silicon layer 113 and thereafter the single-crystal SiGe layer 118 are grown during the same epitaxial process. Both layers 113 and 118 can be doped or undoped. Away from active area 102, a silicon germanium layer 124 is deposited in polycrystalline form over STI regions 126 and dielectric layer 105 during the epitaxial growth.

Thereafter, as shown in FIG. 5, a layered stack of polycrystalline semiconductive and dielectric materials are deposited. A first relatively thin polycrystalline semiconductive layer 120 is deposited. Preferably, layer 120 consists essentially of polycrystalline silicon (also referred to herein as "polysilicon"). Polysilicon layer 120 can be doped or undoped. Thereafter, a relatively thick layer of polycrystalline silicon germanium (SiGe) 122 having a composition $Si_xGe_{100-x}$ is deposited, where x represents the percentage of silicon in the composition, and 100-x represents the percentage of germanium.

Such layer 122 desirably has a thickness of 500 Å or more. Layer 122 preferably has a germanium content of greater than twenty percent, more preferably greater than 28%, and more preferably having an even greater percentage content of germanium. In an HBT 100 having an NPN structure, polycrystalline SiGe layer 122 and intrinsic base 112 both include a p-type dopant such as boron. The presence of germanium in a substantial percentage together with the dopant boron result in layer 122 having substantially less resistance than a layer of equivalently doped polysilicon. This layer 122, which will desirably make up the majority of the thickness of the raised extrinsic base when fully fabricated, lowers the overall resistance of raised extrinsic base, thereby improving the performance of the HBT 100. For example, the sheet resistance of boron doped polycrystalline SiGe layer with 10% Ge content is 23% lower than an otherwise equivalent boron doped polysilicon layer. The resistance of polycrystalline SiGe can be further reduced by increasing the Ge content, which also further increases the RIE etch selectivity of SiGe to silicon, as will be discussed below.

Thereafter, a second layer 138 of polysilicon is formed by deposition over layer 122. Polysilicon layer 138 can be doped or undoped. Thereafter, a dielectric layer 136 is deposited over the layer 138, such layer 136 serving as an isolation layer between the emitter 114 and the extrinsic base 120, as well as, a hardmask layer during an etch step performed subsequent thereto, as will be described below. Layer 136 preferably includes silicon dioxide, such as, for example, a TEOS oxide, or borophosphosilicate glass (BPSG).

Next, as illustrated in FIG. 6, an opening 135 is made in dielectric layer 136 and layers 138 and 122. This is performed as follows. A photoresist (not shown) is deposited over dielectric layer 136 and then patterned to expose the dielectric layer 136 within an area overlying opening 135. The dielectric layer 136 is then patterned from the exposed opening in the photoresist, as by a reactive ion etch (RIE). Thereafter, the photoresist is stripped, and the polysilicon layer 138 and polycrystalline SiGe layer 122 are etched by RIE with the opening thus made in the dielectric layer 136. Such RIE is first performed to vertically etch the polysilicon material of layer 138, selective to polycrystalline SiGe layer 122. Then, once layer 138 is fully etched, the chemistry of the RIE is changed to vertically etch the polycrystalline SiGe material of layer 122, selective to polysilicon layer 120.

Etch selectivity of SiGe relative to silicon can be achieved by RIE using, for example, an HBr plasma chemistry. For example, the etch rate of polycrystalline SiGe with 28% Ge content is 5 times higher (i.e. selectivity of 5) than the etch rate of silicon in HBr plasma. The RIE etch selectivity can be further increased by increasing the content of Ge in the polycrystalline SiGe layer, which also further reduces its resistance. In addition, the RIE etch selectivity can be further increased by introducing oxygen into the HBr plasma due to higher oxidation rate of silicon and better oxide formation on silicon relative to SiGe. Stated another way, oxide that forms on the polysilicon etch stop layer 120 when etching the SiGe layer 122 in an oxygen-containing plasma increases the etch selectivity, allowing an over-etch step to be performed, which is needed to ensure that openings across the wafer are all etched to a depth which exposes the polysilicon layer 120 below the SiGe layer 122. Moreover, the RIE etch of SiGe stopping on silicon can be aided by end point detection of GeBr byproducts relative to SiBr byproducts in HBr plasma.

Further changes in chemistry and temperature can also be made to enhance selectivity when etching SiGe. For example, selectivity is reported to be about 30 when a chlorine plasma is used at 710 degrees C., as described in U.S. Pat. No. 5,766,999. Other RIE etch chemistries that can achieve high SiGe to silicon etch selectivity include fluorine based plasmas (e.g. $SF_6$ and $CF_4$). In another embodiment of the invention, layers 120 and 122 of the raised extrinsic base both include polycrystalline SiGe, but in compositions having different percentage amounts of germanium. In such embodiment, it is necessary that the second polycrystalline SiGe layer 122 have a substantially greater percentage content of germanium than the first polycrystalline SiGe layer 120 such that the first polycrystalline SiGe layer 120 is etch distinguishable from the second polycrystalline SiGe layer 122, and is conserved when the second layer 122 is etched selective to the composition of the first layer. In such manner, when the opening 135 in the polycrystalline layer 122 is over-etched using a chemistry appropriate therefor, at least a portion of the relatively thin layer 120 is conserved below the opening 135.

In a particular embodiment of the invention, the germanium content of polycrystalline SiGe layer 122 varies as a function of vertical position over the thickness of the SiGe layer 122, "vertical" being defined as normal to the major plane of the substrate 101. Such variation in the germanium content is achieved by varying the supply of source material during the deposition of the layer 122. For example, the supply of source material can be varied as a continuous function to achieve a graded germanium profile over the thickness of the layer. In like manner, the germanium content can be varied as a function of the vertical position in any of the layers 112, 113 of the intrinsic base and in any of the layers 118, 120, 122 and 138 of the extrinsic base.

In yet another particular embodiment of the invention, the dopant concentration of the polycrystalline SiGe layer 122 varies as a function of vertical position over the thickness of the SiGe layer 122, "vertical" having that definition provided above. Variation in the dopant concentration is achieved by varying the supply of dopant material during the deposition of layer 122. In an example, the supply of dopant material can be varied as a continuous function to achieve a graded dopant profile over the thickness of the layer. In like manner, the dopant concentration can be varied as a function of the vertical position in any of the layers 112, 113 of the intrinsic base and in any of the layers 118, 120, 122 and 138 of the extrinsic base.

After such RIE etch, as depicted in FIG. 7, a relatively thin sacrificial spacer 107, preferably consisting of silicon nitride, is formed on a sidewall of the opening 135. Alternatively, the spacer 107 can consist of silicon dioxide or silicon oxynitride. Such spacer is preferably formed by a conventional spacer fabrication technique of depositing a conformal layer of the spacer material and thereafter etching the layer vertically, as by RIE.

With spacer 107 in place, the polysilicon layer 120 and SiGe layer 118 are removed from the area at the bottom of the opening 135. Such removal is preferably performed by first wet etching the polysilicon layer 120 selective to SiGe layer 118, and then wet etching the SiGe layer 118 selective to silicon, stopping on single-crystal silicon layer 113. The chemistry of the wet etch is adjusted to achieve a relatively high degree of etch selectivity during these etches. For example, the polysilicon layer 120 is etched with a chemistry including a dilute solution of Potassium Hydroxide (KOH), which results in good selectivity to polycrystalline SiGe. Thereafter, the polycrystalline SiGe layer 118 is etched with a chemistry including a dilute solution of Ammonium Hydroxide and Hydrogen Peroxide ($H_2O_2$), which results in good selectivity to silicon, which is exposed in layers 120 and 113.

Thereafter, as depicted in FIG. 8, the sacrificial spacer 107 is removed. An oxide layer 131 is then formed by conformal deposition, as from a TEOS precursor, after which a nitride spacer 134 is formed by conformally depositing a layer of silicon nitride and then vertically etching that layer, as by RIE.

Thereafter, as illustrated in FIG. 9, a series of steps are performed to form the emitter 114 of the HBT 100. In these steps, the oxide layer 131, where not covered by the nitride spacer 134, is wet stripped by an etch process selective to silicon, leaving behind oxide spacer 132. Polysilicon is then deposited to contact the silicon layer 113 and fill the opening 135 to form the emitter 114. A dielectric layer 150, preferably including silicon nitride, is deposited on the emitter polysilicon layer to serve as a hardmask in a subsequently performed step. Thereafter, a photoresist (not shown) is patterned to expose the dielectric layer 150 in areas except where it overlies the filled opening of the emitter 114. Next, the dielectric layer 150 is RIE etched using the photoresist. The photoresist is then stripped, and the emitter 114 is then patterned, as by RIE, selective to the silicon nitride material of the hardmask layer 150. Thereafter, the underlying oxide dielectric layer 136 is patterned as by RIE, selective to silicon, such that polysilicon layer 138 is exposed.

Figure 10:
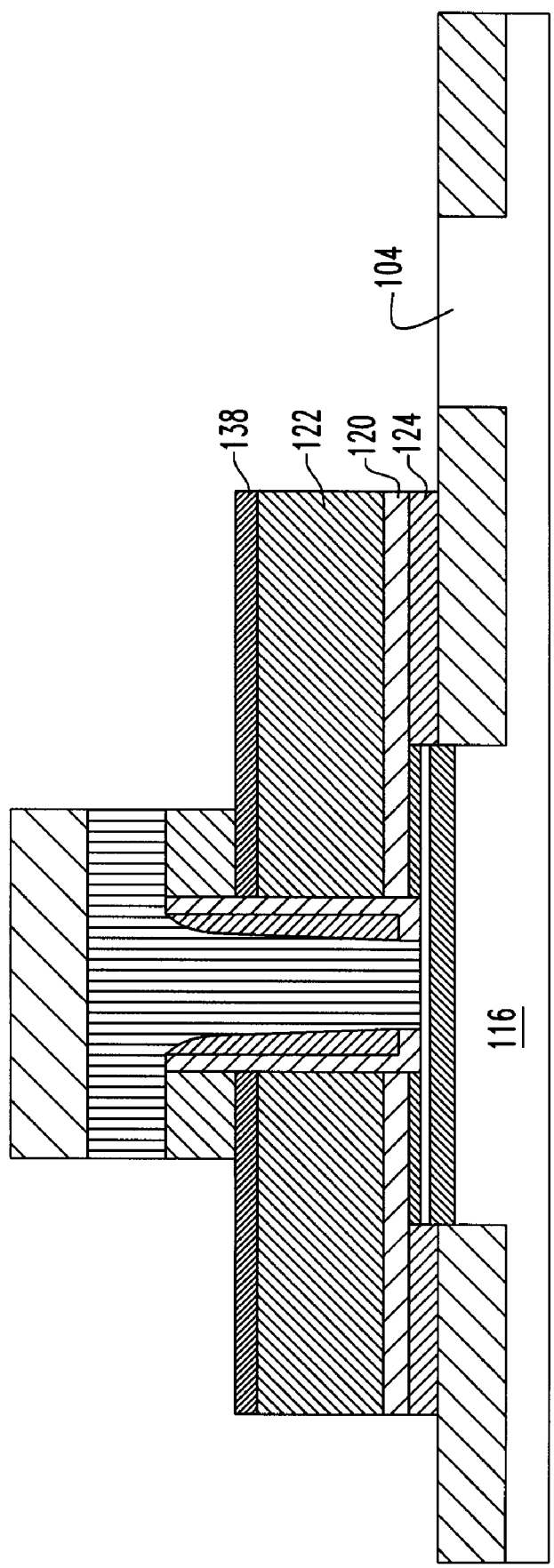

Thereafter, as illustrated in FIG. 10, a photoresist pattern (not shown) is used to RIE etch the extrinsic base stack in order to define the extrinsic base region. Polysilicon layer 138, polycrystalline SiGe layer 122, the polysilicon layer 120, and the underlying polycrystalline SiGe layer 124 are RIE etched stopping on the dielectric layer 105 (see FIG. 9). The dielectric layer 105 is then removed to expose the collector reach-through area 104 to enable contact to the collector region 116.

Figure 11:
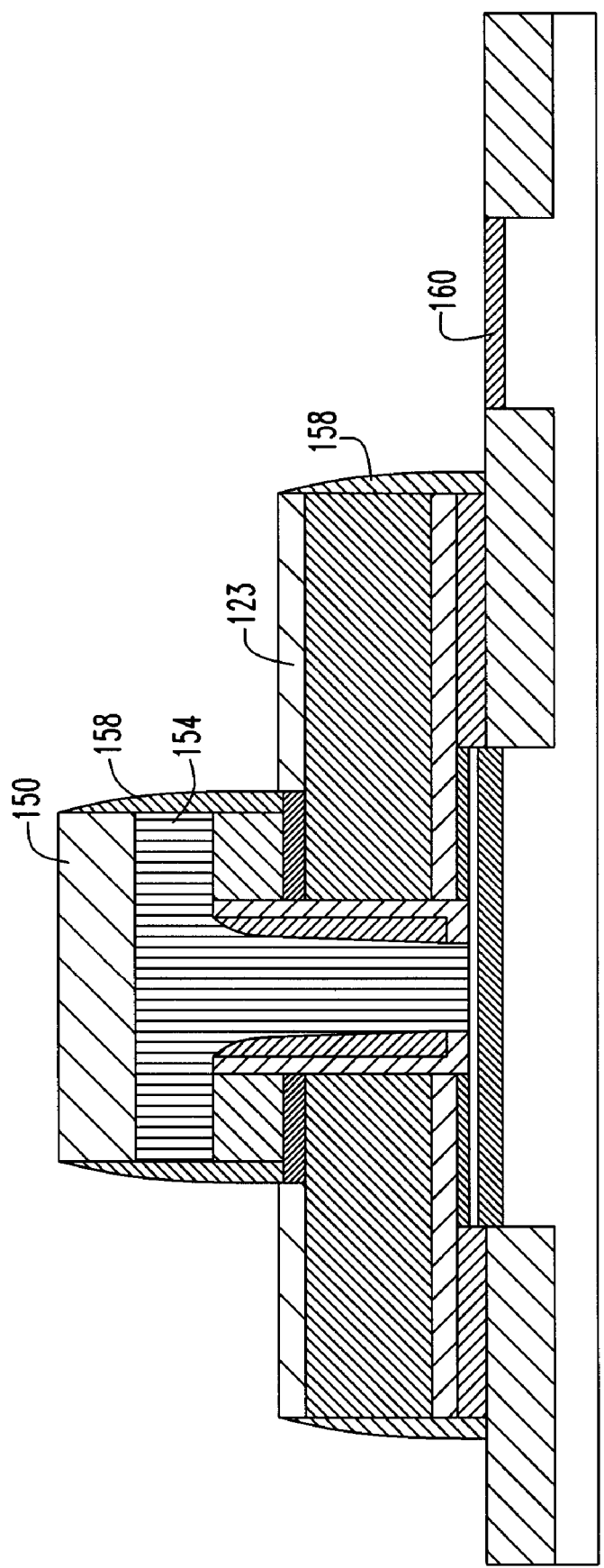

Nitride spacer 158, as shown in FIG. 11, is then formed on exposed vertical surfaces of the emitter 114 and the stack of semiconductive materials. A silicide 160 is now desirably formed on exposed upwardly facing surfaces of polysilicon layer 138 and the single-crystal silicon collector reach through area 104. Such silicide 160 is formed by depositing a metal which readily reacts with silicon under appropriate conditions to form a silicide, thereafter applying the conditions, e.g., moderately high temperature, to form the silicide, and then etching away unreacted metal selective to the silicide, leaving the silicide in place.

Finally, as illustrated in FIG. 3, further steps are performed to complete the HBT 100. A conformal layer 148 of silicon nitride is deposited over the structure shown in FIG. 11. An interlevel dielectric 146, preferably consisting essentially of an oxide such as from a TEOS precursor or, alternatively, borophosphosilicate glass (BPSG) is thereafter deposited and then planarized to a desirable level 147. A photoresist pattern is thereafter deposited and then photolithographically patterned. Via holes corresponding to the conductive contacts 140, 142 and 144 are then etched, as by RIE, into the interlevel dielectric 146, stopping on or endpointed on silicon nitride. Thereafter, the silicon nitride 148 exposed at the bottom of the via holes is removed, as by RIE etching, selective to the silicide 123 or 160 below. In the case of via hole 140, the silicon nitride 150 is also etched by this step to expose the emitter 114. After the via holes have been extended to the silicide 123 and 160, the via holes are then filled with a metal and/or a metal silicide to form the conductive contacts 140, 142 and 144.

Figure 12:
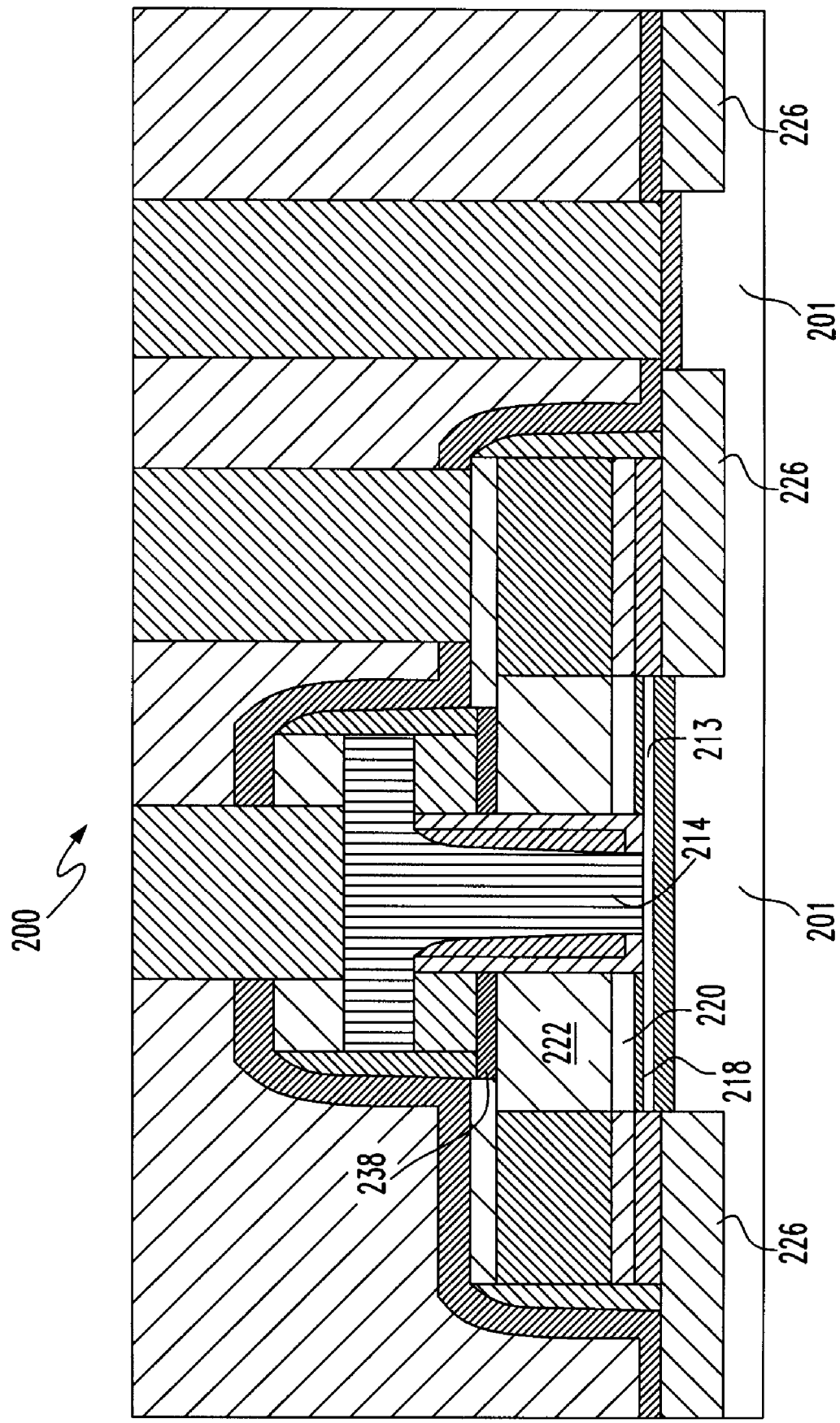
FIG. 12 illustrates a self-aligned heterojunction bipolar transistor according to a second preferred embodiment of the invention.

FIG. 12 illustrates an HBT 200 according to a second preferred embodiment of the invention. Like the HBT 100 illustrated in FIG. 3, HBT 200 includes a raised extrinsic base which is self-aligned to the emitter 214. However, unlike the HBT 100, portions 238, 222, and 220, and 218 of the raised extrinsic base, and SiGe layer 212 and silicon layer 213 of the intrinsic base are single-crystal semiconductor layers. Referring again to FIG. 5, such single-crystal layers are formed by a variation of the process shown therein. In this embodiment, conditions for blanket epitaxial growth are maintained in the fabrication chamber after SiGe layer 218 is fully formed. Such layers retain a single-crystal structure where they overlie the single-crystal substrate 201. Where the deposited material overlies shallow trench isolations 226, the resulting structure becomes polycrystalline. The HBT 200 formed according to this embodiment has lower base resistance than the HBT 100 shown in FIG. 3 because the single-crystal layers 220, 222 and 238 have improved interface quality, particularly because the raised extrinsic base has a single-crystal structure at the interface between the raised extrinsic base and the intrinsic base.

Figure 13:
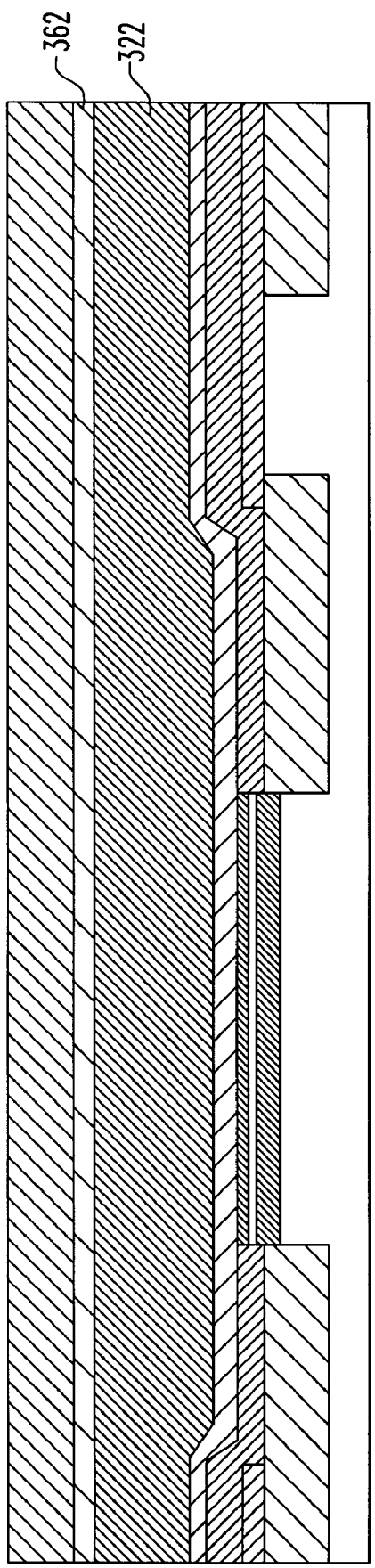
FIGS. 13 and 14 illustrate a self-aligned heterojunction bipolar transistor and its fabrication according to a third preferred embodiment of the invention.
Figure 14:
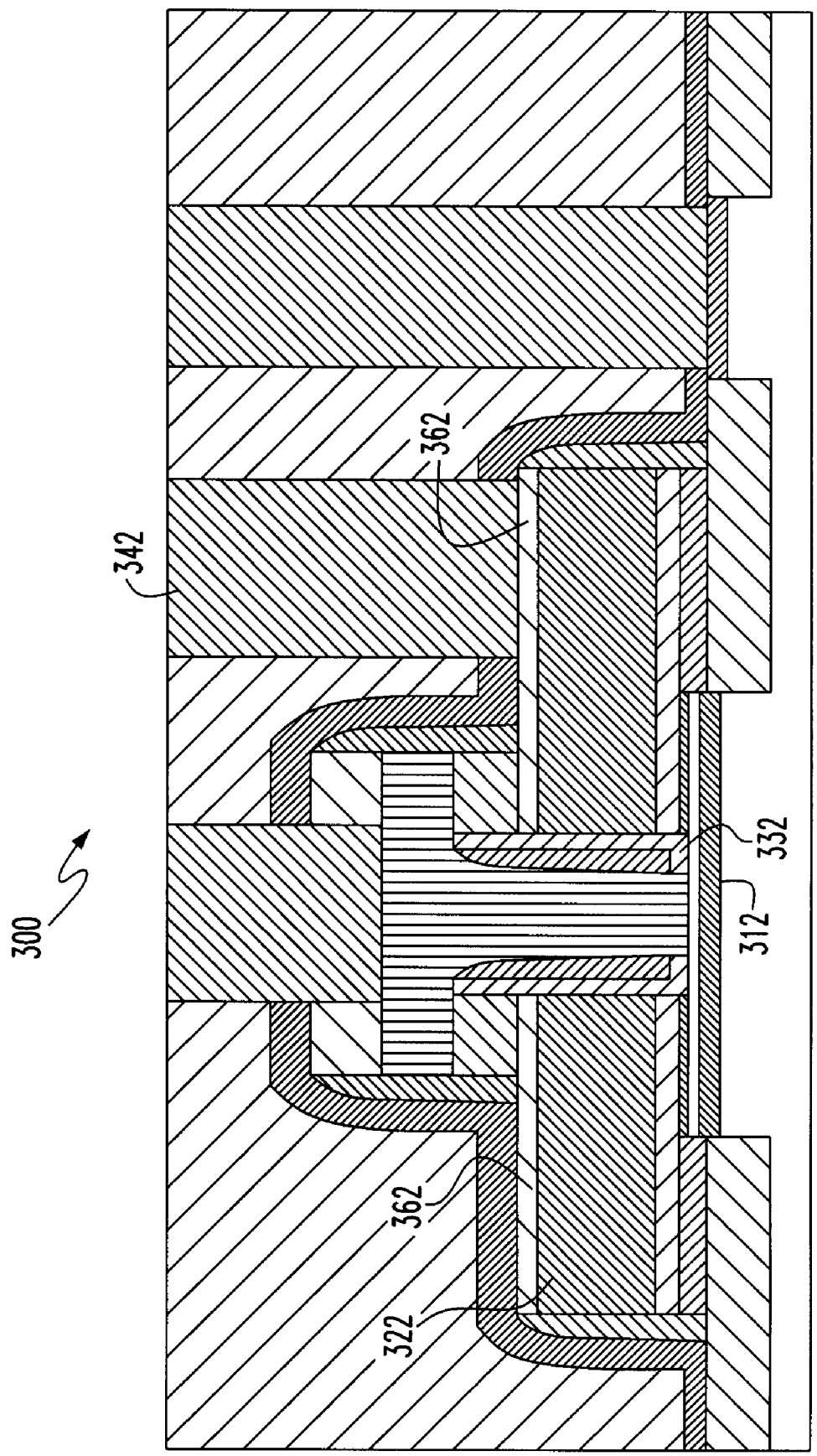

FIGS. 13 and 14 illustrate another preferred embodiment of the invention. As illustrated in FIG. 13, this embodiment varies from the embodiment illustrated in FIGS. 3 through 11 in that a layer 362 including a metal and/or metal silicide is deposited over the polycrystalline SiGe layer 322 in the first instance, prior to patterning steps to form the raised extrinsic base and emitter. Accordingly, in the final HBT 300 structure illustrated in FIG. 14, steps to form a self-aligned silicide to the emitter or salicide overlying the polycrystalline SiGe layer 322 are omitted.

A particular benefit arises when such low-resistance layer 362 is formed by blanket deposition prior to patterning, as here. The metal and/or silicide layer 362 of the raised extrinsic base reduces the resistance between the base contact 342 and the intrinsic base 312. In the HBT 300, one of the paths that the base current can take is laterally along a low-resistance metal and/or metal silicide path to the edge abutting the oxide spacer 332 and then downwardly through polycrystalline SiGe layer 322 towards the intrinsic base 312.

Figure 15:
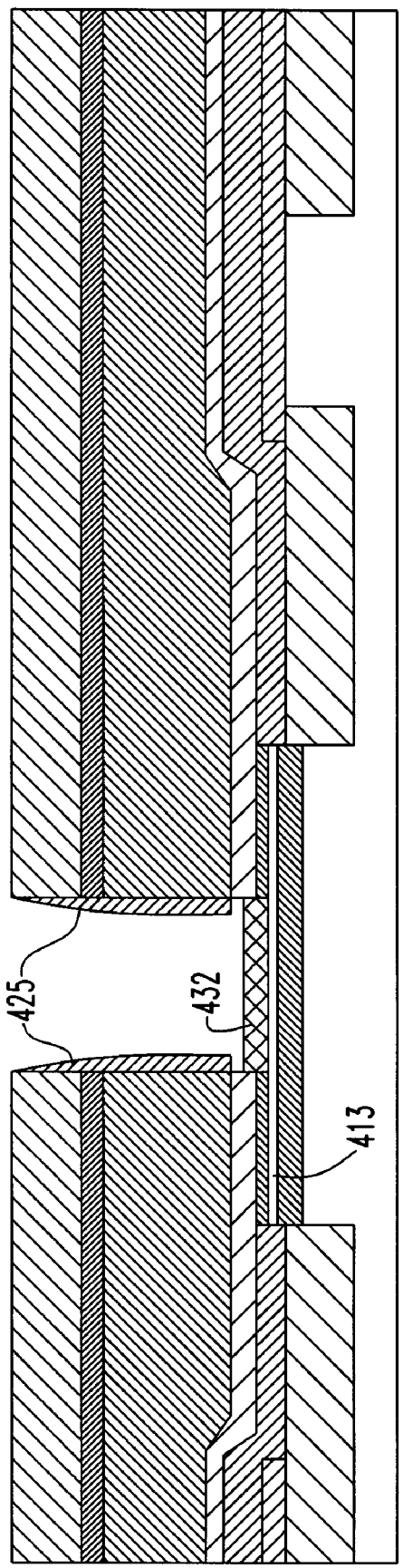
FIGS. 15 through 17 illustrate a self-aligned heterojunction bipolar transistor and its fabrication according to a fourth preferred embodiment of the invention.
Figure 16:
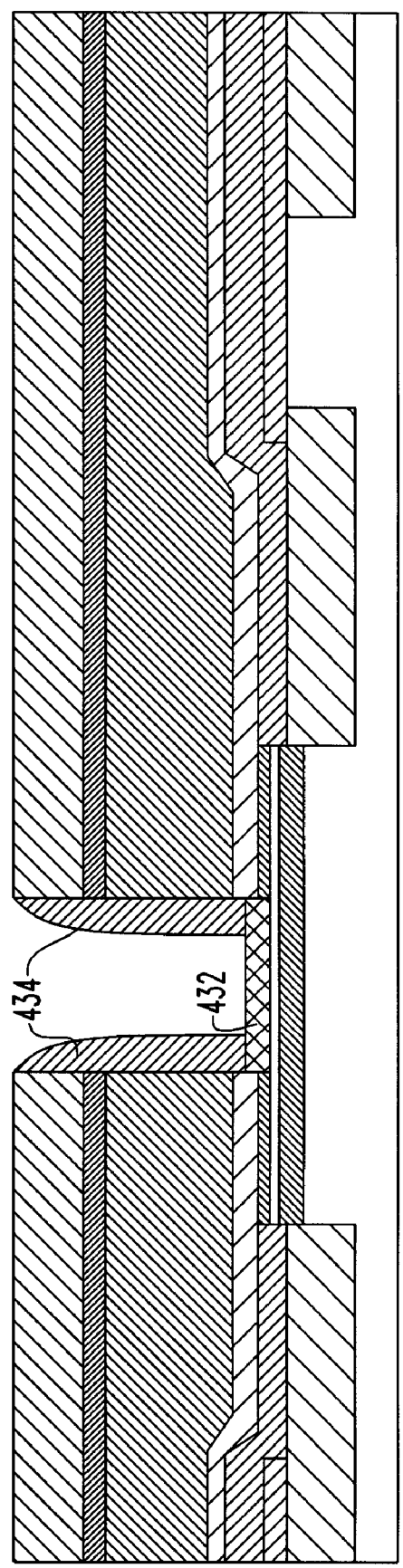
Figure 17:
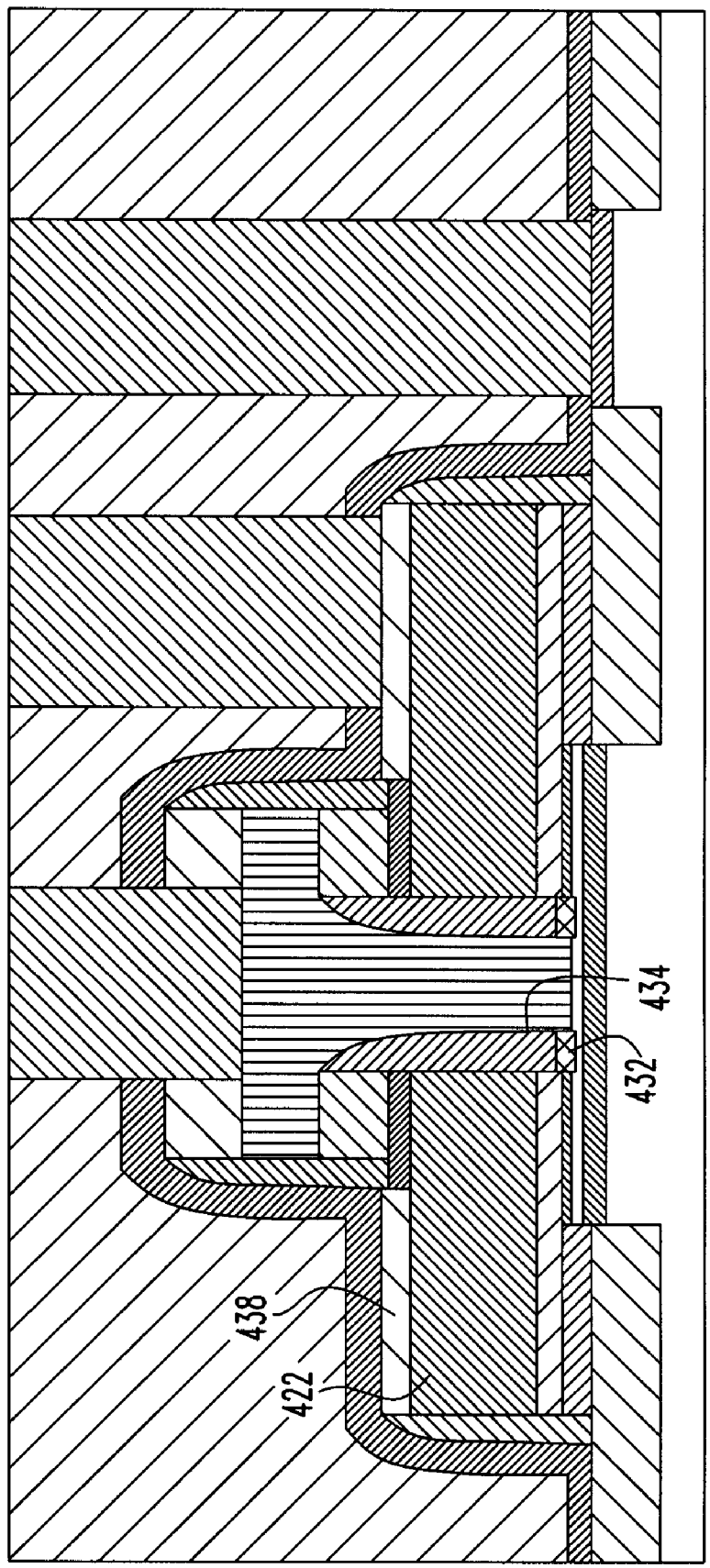

Another preferred embodiment of the invention is illustrated in FIGS. 15 through 17. As shown in FIG. 17, the HBT 400 formed according to this embodiment is the same as that shown and described above with respect to FIG. 3, with the exception that the oxide spacer 132 (see FIG. 3) is replaced by an oxide layer 432 underneath the nitride spacer 434 that extends only between the raised extrinsic base of the HBT and the emitter, and does not extend vertically along the sidewall of the raised extrinsic base. In this embodiment, the nitride spacer 434 extends vertically upwardly from the oxide layer 432 along a sidewall of the raised extrinsic base including polycrystalline SiGe layer 422 and polysilicon layer 438.

Referring to FIGS. 15 and 16, fabrication according to this embodiment proceeds as follows. FIG. 15 illustrates the same process step shown in FIG. 7 to form a relatively thin sacrificial sidewall spacer 425, preferably including silicon nitride, with the additional step of partially oxidizing the exposed portion of the single-crystal silicon layer 413 to form the oxide layer 432 within the emitter opening. Such oxidation process is preferably a thermal oxidation process performed by heating the structure in an atmosphere having available oxygen, such as an atmosphere including molecular oxygen, atomic oxygen, water vapor, steam, etc. Alternatively, another preferred way of oxidizing the silicon layer 413 is by a high-pressure oxidation process (Hipox). Oxide grown using such techniques has a better interface quality compared to deposited oxide.

Thereafter, as shown in FIG. 16, the initial thin spacer 425 is removed, as by wet etching, selective to silicon. When the thin spacer 425 is formed of silicon nitride, it can be removed by etching selective to silicon dioxide, as well. A final spacer 434 including silicon nitride is then formed on the sidewall of the opening above the oxide layer 432, which serves as an etch stop layer for RIE etch of spacer 434.

Thereafter, as shown in FIG. 17, further processing is performed, in like manner to that described above with respect to the first embodiment. More specifically, fabrication proceeds according to that described above with respect to FIGS. 9 through 11 and FIG. 3, resulting in the HBT structure 400 illustrated in FIG. 17.

In the foregoing, preferred embodiments of HBTs are described which include a layer of polycrystalline silicon germanium (SiGe) as the major element of the raised extrinsic base. Such layer is disposed over a relatively thin layer consisting essentially of silicon which provides an etch stop layer when the overlying SiGe layer is vertically etched to form an emitter opening. Thereafter, the thin polysilicon layer is removed in a straightforward manner, such that the emitter is formed in the opening thereafter in contact with the intrinsic base. In such manner, the raised extrinsic base is self-aligned to the emitter. Besides simplifying the process of self-aligning the raised extrinsic base to the emitter, the polycrystalline SiGe layer of the raised extrinsic base reduces the base resistance. Doped polycrystalline and single-crystal SiGe have lower resistance than comparable doped polysilicon and single-crystal silicon.

While the invention has been described in accordance with certain preferred embodiments thereof, those skilled in the art will understand the many modifications and enhancements which can be made thereto without departing from the true scope and spirit of the invention, which is limited only by the claims appended below.

What is claimed is:

1. A heterojunction bipolar transistor (HBT), comprising:
a collector;
an intrinsic base overlying said collector, said intrinsic base including a layer of a single-crystal semiconductor alloy;
a raised extrinsic base including a first semiconductive layer overlying said intrinsic base and a second semiconductive layer formed on said first semiconductive layer, said first semiconductive layer being etch distinguishable from said second semiconductive layer; and
an emitter overlying said intrinsic base, said emitter disposed in an opening of said first and second semiconductive layers, such that said raised extrinsic base is self-aligned to said emitter,
wherein said first semiconductive layer has a first composition $Si_{x1}Ge_{y1}$, where x1 and y1 represent precentages of silicon and germanium of said first composition, respectively, and said second semiconductive layer has a second composition $Si_{x2}Ge_{y2}$, where x2 and y2 represent precentages of silicon and germanuim of said second composition, respectively, said precentages y1 and y2 of germanium being sufficiently different to make said semiconductive layer etch distinguishable from said second semiconductive layer and at least one of said precentages y1 and y2 of germanium varies as a function of vertical position over a thickness of said first semiconductive layer or said second semiconductive layer, respectively.

2. A heterojunction bipolar transistor (HBT), comprising:
a collector;
an intrinsic base overlying said collector, said intrinsic base including a layer of a single-crystal semiconductor alloy;
a raised extrinsic base including a first semiconductive layer overlying said intrinsic base and a second semiconductive layer formed on said first semiconductive layer, said first semiconductive layer being etch distinguishable from said second semiconductive layer; and an emitter overlying said intrinsic base, said emitter disposed in an opening of said first and second semiconductive layers, such that said raised extrinsic base is self-aligned to said emitter, wherein said first semiconductive layer has a first composition $S_{x1}Ge_{y1}$, where x1 and y1 represent percentages of silicon and germanium of said first composition, respectively, and said second semiconductive layer has a second composition $Si_{x2}Ge_{y2}$, where x2 and y2 represent percentages of silicon and germanium of said second composition, respectively, said percentages y1 and y2 of germanium being sufficiently different to make said first semiconductive layer etch distinguishable from said second semiconductive layer and said first semiconductive layer has a first dopant concentration, and said second semiconductive layer has a second dopant concentration, wherein at least one of said first and second dopant concentrations varies as a function of vertical position over a thickness of said first semiconductive layer or said second semiconductive layer, respectively.

3. The HBT according to claim 1 wherein said second semiconductive layer consists essentially of an alloy of silicon and germanium and said first semiconductive layer consists essentially of silicon.

4. The HBT according to claim 1 wherein said second semiconductive layer has a substantially greater percentage of germanium than said first semiconductive layer.

5. The HBT according to claim 4 wherein said second semiconductive layer has substantially greater thickness than said first semiconductive layer.

6. A heterojunction bipolar transistor (HBT), comprising:
a collector;
an intrinsic base overlying said collector, said intrinsic base including a layer of a single-crystal semiconductor alloy;
a raised extrinsic base including a first semiconductive layer overlying said intrinsic base and a second semiconductive layer formed on said first semiconductive layer, said first semiconductive layer being etch distinguishable from said second semiconductive layer; and an emitter overlying said intrinsic base, said emitter disposed in an opening of said first and second semiconductive layers, such that said raised extrinsic base is self-aligned to said emitter, wherein said first semiconductive layer has a first composition $Si_{x1}Ge_{y1}$, where x1 and y1 represent percentages of silicon and germanium of said first composition, respectively, and said second semiconductive layer has a second corn position $Si_{x2}Ge_{y2}$, where x2 and y2 represent percentages of silicon and germanium of said second composition, respectively, said percentages y1 and y2 of germanium being sufficiently different to make said first semiconductive layer etch distinguishable from said second semiconductive layer, said second semiconductive layer has a substantially greater percentage of germanium than said first semiconductive layer and said first semiconductive layer has a first dopant concentration, and said second semiconductive layer has a second dopant concentration, wherein said first and said second dopant concentrations are substantially different from each other.

7. The HBT according to claim 6 wherein said first and second semiconductive layers include at least portions having a single-crystal structure.

8. The HBT according to claim 1 wherein said raised extrinsic base includes a low resistance layer formed above said second semiconductive layer, said low resistance layer including at least one material selected from metals and metal silicides.

9. The HBT according to claim 8 wherein said low resistance layer includes a salicide, said salicide being a self-aligned silicide formed by depositing a layer of silicon over said second semiconductive layer, depositing a metal onto said silicon layer, and reacting said metal with said layer of silicon to form said salicide.

* * * * *

UNITED STATES PATENT AND TRADEMARK OFFICE
CERTIFICATE OF CORRECTION

PATENT NO. : 6,982,442 B2  Page 1 of 1
APPLICATION NO. : 10/707712
DATED : January 3, 2006
INVENTOR(S) : Kevin K. Chan et al.

It is certified that error appears in the above-identified patent and that said Letters Patent is hereby corrected as shown below:

Column 1, line 6, insert

--Notice of Government Rights
This invention was made with Government support under N6601-02-C-8014 awarded by DARPA.
The Government has certain rights in this invention.--

Signed and Sealed this
Twelfth Day of June, 2012

David J. Kappos
*Director of the United States Patent and Trademark Office*